United States Patent [19]
Rubin et al.

[11] Patent Number: 5,657,335
[45] Date of Patent: Aug. 12, 1997

[54] P-TYPE GALLIUM NITRIDE

[75] Inventors: Michael Rubin, Berkeley; Nathan Newman, Montara; Tracy Fu, Berkeley; Jennifer Ross, Pleasanton; James Chan, Berkeley, all of Calif.

[73] Assignee: The Regents, University of California, Oakland, Calif.

[21] Appl. No.: 146,502

[22] Filed: Nov. 1, 1993

[51] Int. Cl.⁶ ................................................ H01L 33/00
[52] U.S. Cl. ........................ 372/44; 372/43; 372/45; 257/12; 257/103; 117/108; 252/63.3; 438/46; 438/522
[58] Field of Search ................................ 372/43, 44, 45, 372/46; 257/12, 13, 103, 101; 437/129, 905, 127, 107; 117/108, 104

[56] References Cited

U.S. PATENT DOCUMENTS

| | | | |
|---|---|---|---|
| 5,146,465 | 9/1992 | Khan et al. | 372/43 |
| 5,237,182 | 8/1993 | Kitagawa et al. | 257/103 |
| 5,239,188 | 8/1993 | Takeuchi et al. | 257/78 |
| 5,247,533 | 9/1993 | Okazaki et al. | 372/45 |
| 5,281,830 | 1/1994 | Kotaki et al. | 257/103 |
| 5,290,393 | 3/1994 | Nakamura | 437/127 |
| 5,306,662 | 4/1994 | Nakamura et al. | 372/46 |
| 5,385,862 | 1/1995 | Moustakas | 437/107 |

FOREIGN PATENT DOCUMENTS

| | | | |
|---|---|---|---|
| 59-148382 | 8/1984 | Japan | 437/129 |
| 60-72287 | 4/1985 | Japan | 437/129 |
| 61-280616 | 12/1986 | Japan | 437/129 |

*Primary Examiner*—Rodney B. Bovernick
*Assistant Examiner*—Yisun Song
*Attorney, Agent, or Firm*—Pepi Ross; Paul R. Martin

[57] ABSTRACT

Several methods have been found to make p-type gallium nitride. P-type gallium nitride has long been sought for electronic devices. N-type gallium nitride is readily available. Discovery of p-type gallium nitride and the methods for making it will enable its use in ultraviolet and blue light-emitting diodes and lasers. pGaN will further enable blue photocathode elements to be made. Molecular beam epitaxy on substrates held at the proper temperatures, assisted by a nitrogen beam of the proper energy produced several types of p-type GaN with hole concentrations of about $5\times10^{11}/cm^3$ and hole mobilities of about 500 $cm^2$/V-sec, measured at 250° K. P-type GaN can be formed of unintentionally-doped material or can be doped with magnesium by diffusion, ion implantation, or co-evaporation. When applicable, the nitrogen can be substituted with other group III elements such as Al.

54 Claims, 3 Drawing Sheets

P-TYPE GALLIUM NITRIDE

This invention was made with U. S. Government support under Contract No. DE-AC03-76SF00098 between the U.S. Department of Energy and the University of California for the operation of Lawrence Berkeley Laboratory. The U. S. Government may have certain rights in this invention.

BACKGROUND OF THE INVENTION

1. Field of the Invention

This invention relates generally to Gallium Nitride (GaN) semiconductors and their fabrication. Because of its direct band gap of 3.4 ev, GaN should be efficient for luminescence ranging from the visible blue to the ultra-violet (uv) part of the electromagnetic spectrum. The present invention relates to the fabrication and utility of p-Type Gallium Nitride (pGaN) and use of pGaN in semiconductor devices such as uv and blue light-emitting diodes and lasers.

2. Description of Related Art

Many researchers have attempted to make p-doped GaN without success. Two basic methodologies have formed the focus of past research. One method is chemical vapor deposition (CVD) combined with in-situ Magnesium (Mg) doping. This method has been investigated by Amano, et al. (H. Amano, M. Kito, K. Hiramatsu, and I. Akasaki, Jpn. J. Appl. Phys. 28:L2112, 1989), Nakamura et al. (S. Nakamura, T. Mukai, and M. Senoh, Jpn. J. Appl. Phys. 30:L1998, 1991), and Goldenberg (B. Goldenberg, J. D. Zook, R. J. Ulmer, Appl. Phys. Lett. 62:381, 1993). These researchers obtain p-doped GaN with hole mobilities, $\mu$, of about 10 $cm^2$/V-sec. These hole mobilities reflect significant concentrations of deep level impurities that will limit utility of the material in optoelectronic devices. There are other limitations associated with CVD techniques in making GaN. The source of nitrogen ion for CVD growth is typically ammonia gas ($NH_3$). The presence of H decreases the effective hole carrier concentration in GaN S. Nakamura et al., "Hole compensation mechanism of p-type GaN films", Jpn J Appl. Phys, 31: 1258–1266 (1992). It is thought that hydrogen, which can act as an electron donor, binds to Mg or other acceptors forming a complex that no longer acts as an acceptor. Furthermore, CVD subjects the growing overlayer and the substrate to high temperatures, in the range of 1200° C. This restricts the choice of substrates to one that can withstand the high temperatures. The high temperatures are undesirable for layered structures because interdiffusion between layers increases with temperature.

Moustakas has reported an unpublished presentation that he obtained pGaN using molecular beam epitaxy (MBE) with an electron-cyclotron-resonance (ECR) nitrogen plasma source and in-situ Mg doping. He was only able to obtain low hole mobilities of about 1 $cm^2$/V-sec. One problem with an ECR nitrogen source is that the Nitrogen has a wide range of energies when it impinges on the substrate. ECR, which uses microwaves to produce $N_2^+$, $N^+$, and their excited states, $N_2^*$, $N^*$ also produces chamber contaminants because the nitrogen plasma ions can strike the interior walls of the chamber thus releasing secondary materials from the chamber walls. One of the main obstacles to fabricating high quality GaN crystals for electronic applications has been control over the concentration of background contaminants and dopants.

Recently Powell (R. C. Powell et al., J. Appl. Phys. 73(1):189, 1993) produced undoped material with a reduced electron and contaminant concentration using plasma/ion-assisted molecular beam epitaxy. He achieved a free electron concentration of $8 \times 10^{13}$/$cm^3$. However he has not reported successful synthesis of pGaN.

GaN has a direct band gap of 3.4 eV which should be efficient for luminescence ranging from the visible blue to ultra-violet (uv) part of the electromagnetic spectrum. Because it is well known how to fabricate n-type GaN, it would be very desirable to have p-type GaN. Recombination of electrons and holes (either band-to-band or defect mediated) at the p-n junction could then be used as a source of luminescence. It would be even more desirable to have pGaN with high hole mobilities. It would be still more desirable to be able to synthesize pGaN predictably. It wold be even more desirable to predict concentrations of holes and levels of hole mobilities when synthesizing pGaN. It would be additionally advantageous to be able to synthesize GaN at lower temperatures than those required by conventional deposition techniques, such as CVD, so that practical substrates, that are harmed at high temperatures, could be employed. An even further benefit of growing GaN at the lower temperatures is reduced interdiffusion between layers in a layered structure.

DESCRIPTION OF THE INVENTION

Definitions:

Unintentionally doped: A material to which no dopants have been intentionally added, but which exhibits the characteristics of p-doped or n-doped material.

Intentionally doped: A material to which either p-type (acceptor) or n-type (donor) dopants have been added so the material conducts by holes or electrons, respectively.

P-type gallium nitride (denoted pGaN): A chemical compound made of Gallium and Nitrogen in which the concentration of holes in the valence band is greater than the concentration of electrons in the conduction band under equilibrium conditions.

Substrate bias: Throughout this patent, reference to substrate bias is meant to include electrical DC bias applied to the heater block or the growing surface of the forming GaN, all of which is preferably at an equal potential but across which some potential drops may occur due to differences in conductivity of the components.

Defect mediated recombination: Recombination of an electron in the conduction band with a hole; alternatively, recombination of a hole in the valence band with an electron.

Band-to-band recombination: Recombination of an electron in the conduction band with a hole in the valence band.

Epitaxial layers: An over-layer which has a specific orientation relationship between the new layer and the substrate or layer below.

Molecular Beam Epitaxy (denoted MBE): The growth of epitaxial layers using vacuum deposition by evaporation typically using Knudsen cell evaporators under suitable growth conditions.

Chemical Vapor Deposition (denoted CVD): Deposition of layers using a chemical vapor species which dissociates at or near the substrate with one or more components reacting to form a new chemical compound under suitable growth conditions.

Reactive ion beam molecular beam epitaxy (denoted RIMBE): Use of an ion beam to assist in the formation of an epitaxial molecular layer wherein the ion beam supplies a more reactive species than is obtainable by other methods.

SUMMARY OF THE INVENTION

The present invention relates to p-type GaN with hole mobilities, $\mu$, in the range from about 0.1 to 2000 $cm^2$/V-sec.

The pGaN was achieved in unintentionally doped GaN or in GaN intentionally doped with shallow acceptor dopant such as Mg. The doping with Mg can be achieved by diffusion, ion implantation or by co-doping.

Hall measurements indicated that some samples of the unintentionally doped material was near intrinsic. One important aspect of the inventive unintentionally-doped pGaN is thought to be that, as a material with a near stoichiometric relationship of gallium and nitride, it has fewer impurities to scatter holes and detract from the quantum efficiency of a device made with the inventive pGaN. Another important aspect of is thought to be associated with GaN formed with controlled, approximately monoenergetic nitrogen species. Use of RIMBE with an electrically biased substrate provides one of the most controllable methods to grow GaN.

The p-type characteristic of GaN was achieved either by growing unintentionally-doped, GaN or by intentional doping with an acceptor. Doping was achieved by ion implantation, diffusion or by co-evaporation of Mg. An important advantage of the invention is than n-type and p-type GaN can be made with the same apparatus.

Whether unintentionally-doped or intentionally-doped pGaN is made, an additional benefit of using MBE fabrication techniques is that crystal synthesis occurs at lower temperatures than when conventional deposition techniques, such as CVD, are employed. Thus practical substrate choices can be implemented. The lower fabrication temperatures also have the benefit of reducing interdiffusion between layers in layered structures.

It is an object of this invention to provide p-type Gallium Nitride. It is a further object of this invention to provide unintentionally-doped pGaN. It is yet a further object of this invention to provide intentionally p-doped GaN. It is still an additional object of this invention to provide pGaN on sapphire, Gallium Arsenide, silicon or GaN substrates. It is another object of this invention to provide a means for fabricating pGaN in a manner that controls the resultant hole mobility. It is yet an additional object of this invention to provide a method for controlling the concentration of holes in pGaN. It is still an additional object of this invention to provide a method of growing pGaN, at temperatures sufficiently lower than those required by conventional deposition techniques, to reduce interdiffusion between layers. An even further object of the present invention is to provide a fabrication method that accommodates a variety of substrates that are damaged by the temperatures required by current methods. Even more desirable, it is an object of this invention to provide GaN for use in Blue and UV LED's and lasers; high temperature and high power devices, and underwater signal transmission devices.

DESCRIPTION OF THE INVENTION

Gallium nitride has a direct bandgap of 3.4 eV, which makes it a promising semiconductor material for light emitting devices in the blue and uv range. GaN's large bandgap value and thermal conductivity, make it useful in high temperature and high power electrical devices as well. The principal technical problem that has prevented use of GaN in these and other applications to date has been the difficulty in obtaining p-type GaN (pGaN) and more particularly development of GaN with predictable or controllable levels of p-type doping.

Figure 1:
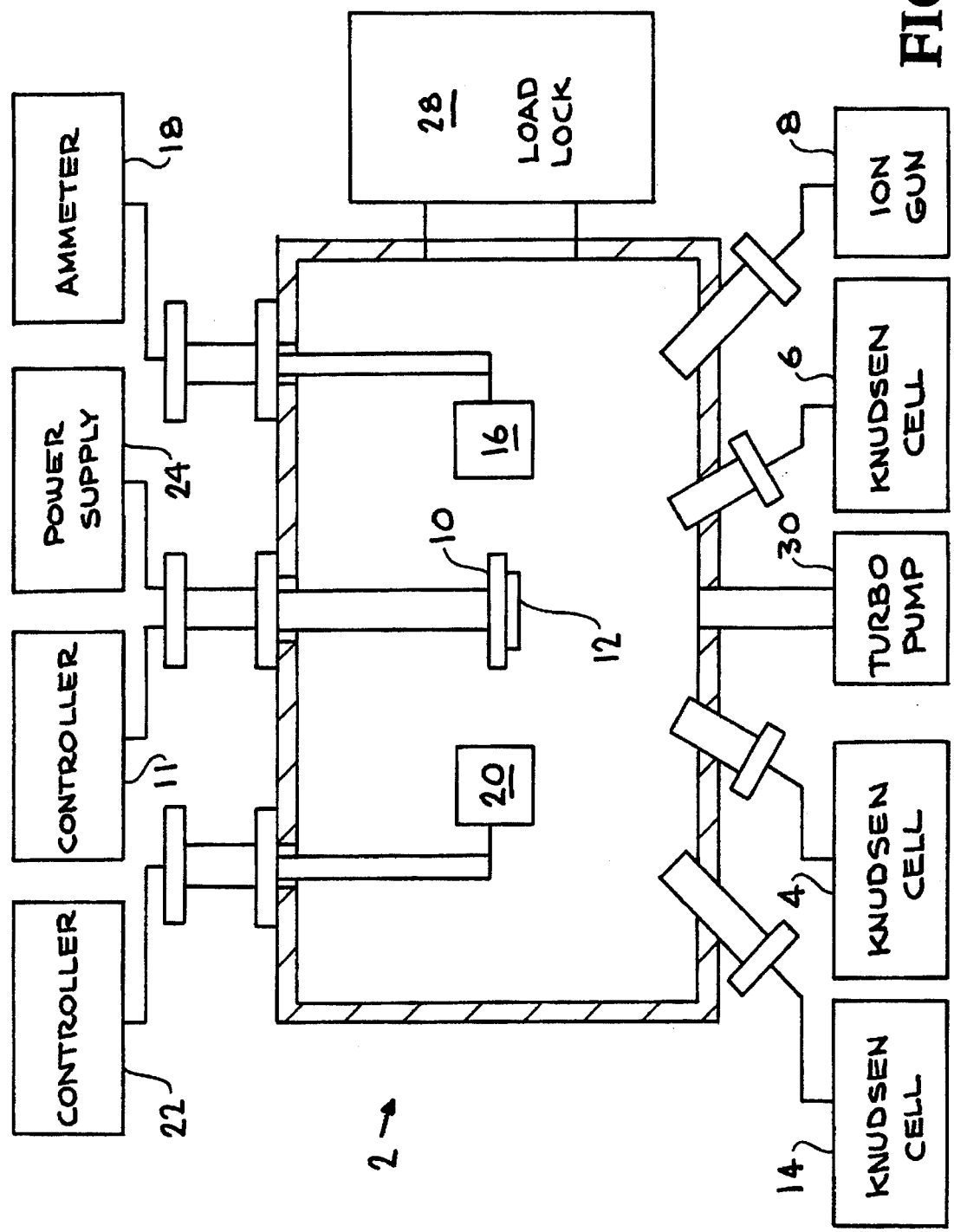
FIG. 1: is a diagrammatic representation of the ion-beam MBE system used to produce pGaN.

The present invention comprises pGaN made with a reactive ion molecular beam epitaxy (RIMBE) apparatus (FIG. 1). The RIMBE apparatus was comprised of a turbo-molecular pumped vacuum chamber 2, a Knudsen cell 4 to supply gallium, a Knudsen cell 6 to supply magnesium, a Kaufman ion gun 8 to supply the atomic and molecular ionic nitrogen species, and a molybdenum heater block 10 to which the substrate 12 was mounted with platinum foil and molybdenum clamps. Optional additional Knudsen cells 14 may be added to the system to deliver other materials, such as aluminum or silicon, as needed for specific devices. A moveable Faraday cup 16 connected to an ammeter 18 was used to measure the nitrogen ion current delivered at the substrate position. A moveable quartz-crystal oscillator 20 and controller 22 was used to measure the gallium flux at the substrate position. A power supply 24, applied a DC bias to the substrate. A heater 10 and controller 11 was used with a 120 V Variac to limit the voltage to the heater filament. The load lock 28 was optionally used to transfer samples into the apparatus without breaking the vacuum seal. A turbo pump 30 was used to evacuate the vacuum chamber. A mass flow controller was used to introduce nitrogen into the ion-gun discharge chamber. Optical emission spectra taken of the ion beam, identified $N_2^+$ as the principal ion species present.

This RIMBE apparatus was used to produce unintentionally-doped pGaN with hole mobilities exceeding 400 $cm^2$/V-sec and carrier concentrations of $5 \times 10^{11}/cm^3$. Hall measurements showed the pGaN to be near intrinsic. The same RIMBE apparatus was used to produce pGaN doped by use of a number of conventional integrated circuit processing techniques including ion implantation, diffusion, and coevaporation of magnesium. The same apparatus was used to produce n-type GaN.

The GaN was formed by obtaining a vacuum of about $10^{-8}$ Torr or better; closing shutters to all Knudsen cells and the ion gun; optionally lifting the substrate heater out of the growth position if flux measurements are to be taken; outgassing components in the vacuum chamber by raising the temperature appropriately (frequently about 800° C. was used); adjusting the Ga K cell to the operating temperature; adjusting other K cells that might be used in the run (such as for Mg or Al) to the appropriate temperature; turning on the nitrogen flow to the ion gun; turning on the ion gun; setting the discharge voltage, anode voltage, and cathode current to the desired parameters; optionally making flux measurements; setting the heater and attached substrate into the GaN film growth position; applying a DC bias to the heater (and therefore to the substrate and growing surface of the film); opening the ion gun and Ga K cell shutters; growing buffer layer of GaN (frequently about 5 minutes at about 500° C. was used); optionally opening other K cell shutters as appropriate; adjusting the substrate temperature to the appropriate temperature as described below; allowing GaN to form for desired time (frequently about 4 hours was used); closing the K cell and ion gun shutters; cooling the substrate and GaN in the vacuum chamber, optionally in the presence of nitrogen gas (frequently about 1 mTorr nitrogen gas was used). As will be apparent to those of ordinary skill in the art, many of these steps can be performed in a different order, at different temperatures, for different amounts of times, or with other minor variations than presented in the example above.

Alloys of the inventive pGaN are made in which up to 20% of other group III elements are used, for example, aluminum, indium, thallium, or boron. Such group III alloys are useful in heterostructures.

The substrate temperature must be essentially maintained in the temperature range between about 500° C. and about 950° C. during deposition of the GaN material. The substrate temperature was more preferably essentially maintained between the temperatures of about 550° C. and about 900° C. during deposition of the GaN material.

To make unintentionally-doped pGaN, the temperature was preferably maintained essentially in the lower temperature range, from about 550° C. to about 650° C. More optimally, to make unintentionally-doped pGaN, the substrate temperature was essentially maintained between the temperatures of 590° C. and 630° C. during deposition of the GaN material. Most optimally, the substrate temperature was essentially maintained between the temperatures of about 595° C. and about 620° C.

To make intentionally doped pGaN, the temperature of the substrate was preferably maintained in the lower temperature range, but could be made using the entire range from about 590° C. to about 900° C. More optimally, to make intentionally doped pGaN, the substrate temperature was essentially maintained between the temperatures of 600° C. °C. and 700° C. during deposition of the GaN material.

At substrate temperatures above 850° C., film decomposition began to be a factor in fabrication of the GaN. The rate of thermal decomposition is a fundamental limitation encountered when growing high quality GaN thin films. Activated species are important in reducing both the free energy of reaction and overcoming kinetic barriers of growth. Growth of high quality GaN films is controlled by a competition between the forward reaction, which depends on the arrival of activated nitrogen species at the growing surface, and the reverse reaction which rate limiting step is the unusually large kinetic barrier of decomposition of GaN (Thermodynamic And Kinetic Processes Involved In The Growth Of Epitaxial GaN Thin Films, by N. Newman, J. Ross and M. Rubin, Appl. Phys. Lett, 62(11):1242–44 (15 Mar. 93), incorporated herein by reference. We speculate that growing GaN within the optimum temperature ranges overcame the kinetic energy barriers of surface diffusion, formation of epitaxy, and chemical reaction on the growing surface.

Use of a nitrogen ion beam as a source of nitrogen enhances GaN film formation because the nitrogen ion beam is high in activated $N_2^+$ species. This is thought to drive the forward reaction of GaN. Furthermore, an ion gun provides a better source of $N_2^+$ and $N^+$, and the excited states, $N_2^*$, $N^*$ than ECR because a commercially available gun can generate activated nitrogen species a significant distance from the walls inside the vacuum chamber. Placing the gun inside the vacuum chamber eliminates the opportunity for contamination to arise when the nitrogen beam interacts with the chamber walls where it enters the vacuum chamber. Furthermore, using a nitrogen ion beam it is possible to control the energy with which the nitrogen ions impact the surface of the growing film. In contrast, electron cyclotron resonance used by Moustakas, provides a less monoenergetic source of nitrogen ions and introduces contaminants from the source chamber into the GaN deposition site. Nitrogen ion energy at the surface of the growing film was controlled by applying an electrical bias between the nitrogen ion gun anode and the GaN substrate. The nitrogen gun anode voltage was chosen to be only enough greater than the discharge voltage (the voltage that ionizes the plasma) to allow the ions to be extracted. A discharge voltage of |25 V| was chosen as the lowest voltage at which a plasma could be struck. Typically, about 3 to about 5 volts difference between the anode and discharge voltages was sufficient. Because there is typically a small drop in voltage between the anode and the plasma potential, an anode voltage of about 30 V resulted in a plasma potential of about 28 V. Thus a plasma potential of about 28 V combined with a substrate bias of about 18 V resulted in nitrogen ions that were approximately monoenergetic with an energy of about 10 V. While it may be possible to operate at different anode and substrate voltages than the above while maintaining a difference of 10 volts, a higher energy beam results in degraded film quality.

The ion gun can be configured to limit direct high energy impact of nitrogen ions on the growing GaN surface. The filament is hooded so it is not in line of sight with the substrate. Further, the extraction grid is opened with a hole to limit the number of ions that recoil off it. The latter step has the duel effect of 1) preventing recoiling ions from striking the growing surface at full energy and 2) reducing contaminants by limiting the secondary emissions that arise from nitrogen-grid collisions.

A hollow anode ion gun is particularly useful for fabrication of pGaN. It provides clean, low energy, ions that are approximately monoenergetic. The hollow anode ion gun is described in a paper by V. I. Miljivek, "Some characteristics of the hollow anode ion source," Rev. Sci. Inst., 63(4):1992, 2619–2621.

To make n-type GaN (nGaN) using the RIMBE apparatus, the substrate bias was set to zero. The energy of impinging nitrogen ions can be reduced by applying up to 5 volts (V) to the substrate. To make unintentionally doped pGaN, the electrical bias on the substrate was preferably between about 5 Volts (V) and about 25 V resulting in nitrogen ion energies of about 23 V to about 3 V if the anode voltage was about 30 V resulting in a plasma voltage of about 28 V. More preferably the electrical bias was between about 12 V and about 22 V resulting in nitrogen ion energies of about 16 V to about 6 V if the plasma voltage was about 28 V. Most preferably, the electrical bias was between about 16 V and about 20 V resulting in nitrogen ion energies of about 12 V to about 8 V if the plasma voltage was about 28 V.

The substrate was biased electrically by applying a voltage to the heater block on which the substrate was mounted. In some cases the pGaN was grown on a substrate that was electrically insulating, for example sapphire. Under those circumstances, the film was biased by mounting the substrate on the heater with platinum foil which improved the thermal and electrical contact between the substrate and the heater block. The electrically conducting foil and clamps were in electrical contact with the heater. Then a low quality intermediate layer of GaN was grown for about 5 minutes at a substrate temperature of about 500° C. This intermediate layer is sometimes referred to as a buffer layer. The buffer layer is more electrically conductive than sapphire and puts the growing surface of the film at, or near, the same potential as the heater. The GaN layer is more conductive in the higher temperature ranges, around 800° C. When the GaN was grown at 500° C. or 600° C., the center of the film was at a lower voltage than the portion of the GaN near the heater block clamps and the highest quality film was found near the heater block clamps. It will be obvious to those skilled in the art that a specially designed holder, a conductive substrate, or deposition of a first conductive layer would put the entire growing surface of the substrate at an essentially equal potential. Throughout this patent, reference to substrate bias is meant to include bias applied to the heater block or the growing surface of the forming GaN, all of which is preferably at an equal potential but across which some potential drops may occur due to differences in conductivity of the components. The parameters of discharge voltage, anode voltage, and substrate/heater/film voltage can be adjusted for optimum growth by those of ordinary skill in the art.

GaN made with a substrate temperature of about 600° C. and about 18 V bias between the substrate and ground, with a discharge potential of about 25 V and an anode potential of about 28 to about 30 V, results in p-type GaN without additional doping. This may be because GaN produced in this manner is more stoichiometric than GaN produced by other techniques. It also may be because the approximately 10 V, monoenergetic, nitrogen ions reduce the ion damage to the growing GaN.

GaN can be intentionally doped with an acceptor impurity atom such as, for example, Mg. The intentional doping can be achieved by co-evaporation of the acceptor during film formation or by diffusion or ion implantation subsequent to film formation.

The doping levels and acceptor atoms of unintentionally-doped pGaN are further modified by combining these techniques with those of intentional doping.

In laboratory experiments a Kauffman nitrogen ion source using a tungsten filament and a single extraction grid was found to provide a good source of $N_2^+$ ions. Gallium evaporation was performed using a Knudsen cell (K cell). The deposition rate is controlled by setting the temperature of the gallium metal in the K cell. For the K cells used in our experiments, temperatures of about 1075° C. to about 1175° C. were frequently used, resulting in deposition rates of about 0.1 to about 1.0 monolayers per second. When larger K cells are used, temperatures of about 900° C. or 1000° C. may yield the same deposition rate. The nitrogen ion deposition rate was maintained at essentially greater than the Gallium deposition rate, typically by a factor of about ten. When Mg doping was performed by co-evaporation, the Mg was evaporated from a second Knudsen cell. Evaporation temperatures of the magnesium metal can vary greatly but frequently yielded a Mg deposition rate that was between about $10^3$ to about $10^7$ less than the deposition rate of gallium. It has been speculated that too much Mg introduces Mg-related deep defects and decreases hole mobility by decreasing the mean free path of holes.

Several examples below discuss specific settings and parameters used to achieve pGaN fabrication. They are included only as examples and are not intended to be limiting. Many variations in equipment and specific settings can be made by the practitioner skilled in the art to fabricate pGaN for specific applications.

EXAMPLE 1

(unintentionally-doped pGaN)

Basal plane (0001) sapphire substrates were degreased in hot acetone, then rinsed in ethanol before being placed in a vacuum. The substrates were mounted on a molybdenum heater block using 25μ thick platinum foil and molybdenum clamps. The RIMBE apparatus was equipped with a W-A Technologies Series-3 Knudsen cell (K cell), used to evaporate gallium (99.999999% purity). The ion beam source was a Commonwealth Scientific 3 cm single-grid Model II Kaufman ion gun. A model TMP 450 turbo-molecular pump (Leybold-Heraeus, 6500 Fly Road, Syracuse, N.Y. 13057; 315.437-0377) was used to obtain a chamber pressure of about $1 \times 10^{-8}$ Torr. After evacuation, shutters to K cell(s) and the ion gun were closed and the substrate, heater and other chamber components were outgassed at approximately 800° C. Then the heater block was cooled to the desired growth temperature and K cell temperatures were adjusted to about 1075° C.

Next 3.5 standard cubic cm per minute (sccm) of flowing nitrogen (99.999% purity) filtered through a Purifilter PF-NH3 filter (Matheson Semi-Gas Systems; 625 Wool Creek Drive; San Jose, Calif. 95112; 408/971-6500), and metered by an MKS flowmeter, was introduced into the nitrogen ion gun discharge chamber resulting in a chamber pressure of about $8 \times 10^{-4}$ Torr. The Kaufman ion gun was used in the single grid configuration with the accelerator grid grounded, allowing for operation at a typical discharge potential of about 25 V between the anode and the filament and an anode potential of about 30 V relative to ground. Optical emission spectra taken of the ion beam identified $N_2^+$ as the principal nitrogen ion species (Commonwealth Scientific Corp., 500 Pendleton Street, Alexandria, Va. 22314; 703/548-0800). A moveable, model FD-0.4 Faraday cup (Thermionics Vacuum Products, 22815 Sutro Street, P.O.Box 3711, Hayward, Calif. 94540; 510.538-3304) was used to measure the ion current delivered at the substrate position. That is, the substrate was temporarily lifted out of position and the Faraday cup was rotated into the position usually taken by the substrate. The Faraday cup suppression ring was biased at −50 V from ground. The Faraday cup was biased at −10 V. The tantalum face plate was grounded. Then the ion beam was turned on and the $N_2^+$ flux from the ion gun was adjusted by measuring current with a Keithly model 179 TRMS Digital multimeter. Typically, a filament current of about 6 Amps to about 8 Amps and a beam current of about 5 mA to about 10 mA (measured at the exit port of the Kauffman ion gun) resulted in an $N_2^+$ flux that was essentially maintained at a value between about $10^{13}$ ions/cm$^2$-sec and about $5 \times 10^{15}$ ions/cm$^2$-sec during growth. In the Kauffman ion gun used for these runs, the filament current was the same as the cathode current.

Similarly, with the heater and substrate lifted out of the growth position, a moveable quartz-crystal oscillator monitor and controller (Inficon Model XTM with UHV-bakeable head, available at Inficon, Leybold-Heraeus, 6500 Fly Road, Syracuse, N.Y. 13057; 315.437-0377) was used to measure gallium flux at the substrate position. Typically, gallium flux was essentially maintained at a value between about $5 \times 10^{13}$ to about $3 \times 10^{14}$ atoms/cm$^2$-sec.

If necessary the temperature of the Ga K cell was adjusted as was the filament current and in that event, flux was measured again. It is not necessarily important to make Ga flux (via crystal monitor) and beam current (via Faraday cup) measurements with each run.

After the Ga K cell operating temperature and the nitrogen gun filament current were set, the heater with mounted substrate was lowered into the growth position.

The DC bias of 18 V was applied to the heater and the heater temperature was set at about 500° C. Then the ion gun and the Ga K cell shutters were opened. GaN was allowed to grow for about 5 minutes. This formed a buffer layer that can improve adhesion and film morphology and can put the surface of the substrate in electrical contact with the heater block and clamps. This buffer layer is not essential.

To begin growth of the pGaN, the substrate temperature was increased to and essentially maintained in the temperature range of about 600° C.±10° C. Growth time was typically about 4 hours but can be longer or shorter as desired.

After GaN deposition was complete, the K cell and nitrogen gun shutter were closed. The nitrogen pressure was maintained at about $8\times10^{-4}$ Torr (or 1 mTorr) until the substrate temperature dropped below 50° C.

In order to minimize the nitrogen ion-impact damage during the film growth, the substrate to anode potential was controlled. The minimum discharge potential of about 25 V and anode potential of about 30 V (which resulted in a plasma voltage of about 28 V) combined with substrate biasing of about 18 V reduced the impinging $N_2^+$ ion energy to about 10 V. These numbers were chosen to yield the lowest energy reactive nitrogen ions and based in part on the minimum voltage at which the nitrogen gun could reliably operate while maintaining a plasma within the plasma chamber.

Figure 2:
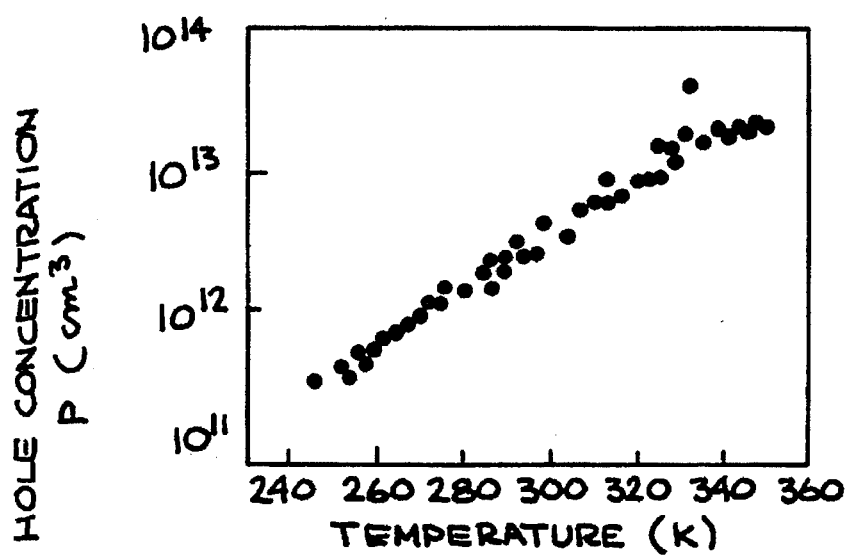
FIG. 2: shows the hole concentration in unintentionally-doped pGaN as a function of temperature.
Figure 3:
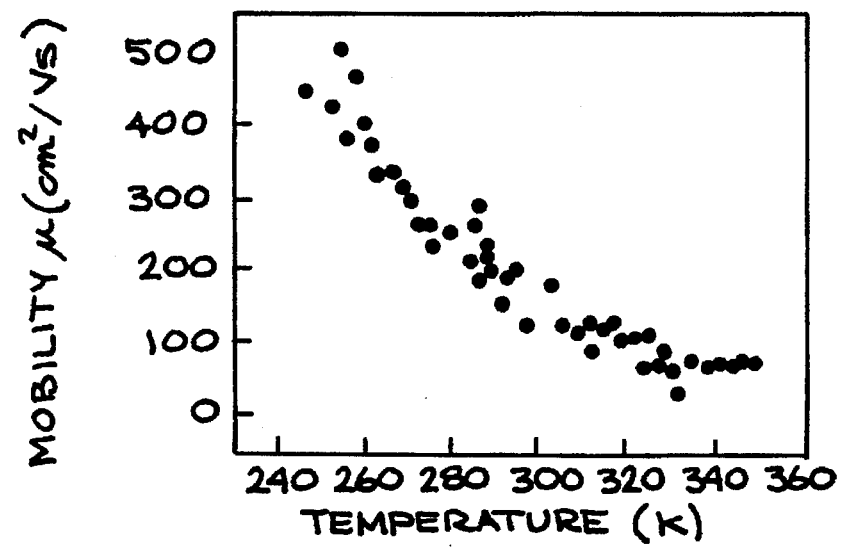
FIG. 3: shows the hole mobility in unintentionally-doped pGaN as a function of temperature.

The above procedure resulted in pGaN without intentional doping. The films had hole concentrations of $5\times10^{11}\mathrm{cm}^{-3}$ and hole mobilities of about 500 $\mathrm{cm^2/V\text{-}sec}$, measured at 250° K. An activation energy of 0.29 eV was calculated from the slope of the hole carrier concentration versus temperature (FIG. 2). FIG. 3 shows that hole mobility is a strongly dependent on temperature, suggesting that phonon scattering dominates the mobility at room temperature. These values for hole concentration and mobility are comparable to those for Gallium Arsenide (GaAs) when adjusted for the strength of the electron-phonon coupling and the Debye temperature, even though the level of impurity in the above RIMBE apparatus is higher than in a conventional GaAs MBE which uses no plasma; the x-ray peaks (an indicator of crystal quality) of the pGaN are wider than x-ray peaks of GaAs.

EXAMPLE 2

(nGaN)

GaN made as above but with the substrate bias set at 0 V and holding the substrate temperature at about 720° C.±180° C. resulted in n-type GaN.

EXAMPLE 3

(intentionally doped pGaN by co-evaporating with Mg)

GaN made as in Example 1 but with Mg co-evaporated during the GaN growth resulted in intentionally p-doped GaN. The RIMBE apparatus was additionally equipped with a Riber, series A.B.N., Knudsen-cell Magnesium source. Because Mg has a high vapor pressure, the operating temperature to produce a typical dopant flux is approximately 200° C. However the series A.B.N. cell manufactured to operate from about 600 to about 1000° C. To circumvent this problem, the thermocouple was changed from W/26%Re–W/5%Re (tungsten-rhenium) to alumel-chromel (type K). For a given temperature, the type K thermocouple puts out approximately 2.3 times the voltage of the tungsten-rhenium thermocouple. The voltage was amplified by a factor of two, using an op-amp circuit. These changes reduced the operating temperature of the Series A.B.N. cell by a factor of 4.6., yielding an operating temperature range of about 130° C. to about 217° C. Immediately after adjusting the Ga Knudsen cell to its operating temperature, the Mg Knudsen cell was adjusted to its operating temperature, typically about 180° C., resulting in a flux of about $10^9$ $\mathrm{cm^{-2}sec^{-1}}$. This was about $10^5$ less than the gallium flux. The practitioner will be able to adjust the Mg deposition parameters for optimum results in each situation. The shutter to the Mg K cell was opened after the buffer layer was grown or just before the heater block was adjusted to the growing temperature of the GaN. The Mg K cell shutter was closed just after or just before the Ga shutter was closed.

The substrate was biased at about 18 V with an ion beam anode potential of 30 V and a discharge potential of about 25 V. pGaN made this way exhibited a hole concentration of $2\times10^{17}\mathrm{cm}^-$ and hole mobilities of about 1 $\mathrm{cm^2/V\text{-}sec}$, measured at room temperature.

Further, co-evaporation of Mg along with Ga deposition converts the process in Example 2, wherein the heater bias is set to 0 V, to a method for making pGaN.

EXAMPLE 4

(intentionally doped pGaN by diffusion of Mg)

N-type GaN was made by the process described in Example 2, above, that is with an electrical bias of 0 V applied to the substrate via the heater. Subsequent diffusion of magnesium into the n-type GaN resulted in conversion of the nGaN to p-type material. The GaN was grown at 600° C. without applying an electrical bias to the substrate. After cooling, the substrate was removed from the vacuum chamber and placed in a quartz ampoule. Small pieces of Mg (~99.99% from Atomergic Chemical Corp; 222 Sherwood Ave; Farmingdale, N.Y. 11735; 516/694-9000) were placed in the ampoule with the film, but not in physical contact with it. Then nitrogen was introduced into the ampoule, it was sealed, and placed in a furnace at about 800° C. for about 80 hours. The nitrogen pressure should be greater than about 1 Torr at room temperature, but can vary as long as it is not so great that the ampoule bursts at the high temperature. The temperature and time parameters can also be varied by one of ordinary skill in the art. Good results were obtained when the ampoule was filled at room temperature with nitrogen to about 300 Torr pressure. The ampoule was then sealed and placed in a furnace for about 80 hours. The furnace temperature during diffusion was approximately 800° C.±100° C. More preferably the furnace temperature during diffusion was about 800° C.±50° C. When the GaN was cooled and removed from the ampoule, Hall measurements taken at room temperature showed a hole concentration had been obtained of about $2\times10^{16}$ holes/$\mathrm{cm}^3$ and a mobility of 12 $\mathrm{cm^2/V\text{-}sec}$. Higher diffusion temperatures resulted in some loss of the film; lower diffusion temperatures failed to convert the material within the 80 hour time interval.

Unintentionally-doped p-type GaN can also be further intentionally doped by diffusion. The procedure above is followed with the exception that the pGaN film is made as described in Example 1, above, for unintentionally-doped pGaN.

EXAMPLE 5

(intentionally doped pGaN by ion implantation of Mg)

Figure 4:
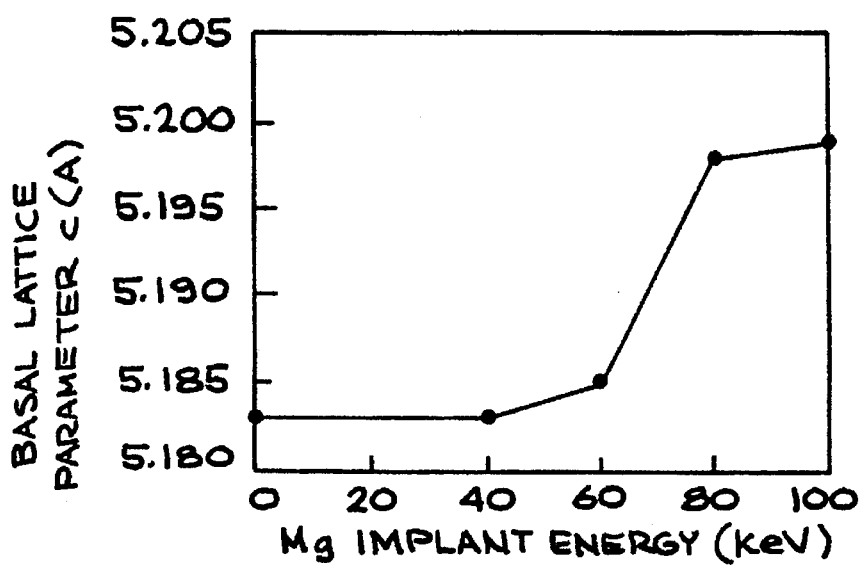
FIG. 4: shows the lattice parameters of p-doped GaN films implanted with Mg at various energies.

Ion implantation using a metal vapor vacuum arc ion source of N-type films resulted in pGaN. The GaN films were grown as described in Example 2, at temperatures of about 600° C. with no substrate bias, before being subjected to ion implantation. The magnesium flux from a broad beam metal vapor vacuum ion accelerator was $2.02\times10^{14}$ $\mathrm{cm}^{-2}$. Several Mg energy levels were assessed. X-ray diffraction measurements showed that 40–60 keV Mg ions successfully implanted into GaN films without disturbing the original basal lattice constant, c(A) (FIG. 4). Implantation energies of 80 keV did not yield p-type material. After implanting the resulting pGaN was annealed in flowing $N_2$ at 800° C. for 30 minutes. The data further suggests that even very low energy Mg, say as low as 1 keV will result in successful implantation. Hot-point probe tests confirmed that these lower energy implants produced p-type conduction. Using a four-point probe technique, room temperature resistivity measurements of the ion implanted films were 4 Ohm-cm.

Unintentionally doped pGaN, made as described in Example 1, can be further doped by ion-implantation as described above.

Important ingredients for making pGaN by Mg implantation comprise, high quality GaN, a broad beam Mg ion source, and implantation energies of about 5 to about 79 keV. The implantation energies are more optimally between about 20 and about 70 keV. Even more preferably the Mg ion implantation energies are between about 40 keV and about 60 keV.

EXAMPLE 6

Figure 5A:
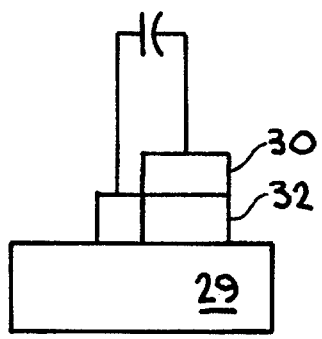
FIG. 5: is a series of diagrams (5A, 5B, & 5C) illustrating use of the inventive pGaN and p-AlGaN for pn junction light emitting diodes.
Figure 5B:
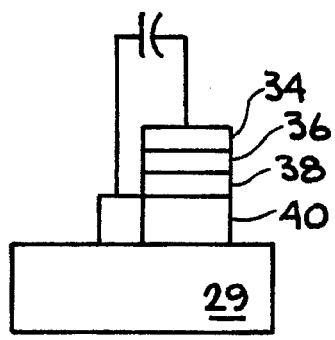
Figure 5C:
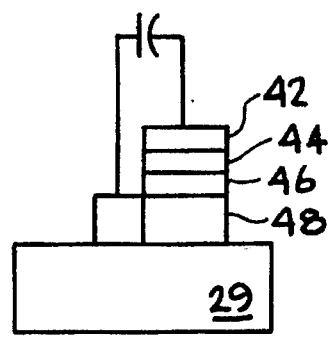

The inventive pGaN is useful for making pn junctions. FIG. 5A, 5B, and 5C show three possible configurations for light emitting diodes in the blue region enabled by the inventive pGaN. FIG. 5A illustrates a simple pn junction. When it is forward biased, as shown, holes are injected into the n-side of the junction and electrons are injected to the p-side. As excess carriers recombine radiatively, they give of photons at the bandgap energy (3.4 eV) or the energy of the defect mediated transition (for example 3.1 eV or 3.25 eV). N-type GaN has been found to luminesce at the bandgap which is in the UV, while p-type GaN has strong luminescence from the transition between the conduction band and the Mg acceptor level which is blue. By doping the n-side much more heavily than the p-type, emission from the junction comes predominantly from the p-side, and vice-versa. Using this technique it is possible to obtain blue or UV LED's. The light is shifted further into the UV by adding Al to the alloy AlGaN which has a wider bandgap than GaN.

FIGS. 5B an 5C illustrate AlGaN/GaN heterostructure junctions. The p-type AlGaN is made using the same methods as p-type GaN. While the Al fraction in these structures is usually not more than 10% of the AlGaN material it can be as high as 20%. The p-AlGaN/GaN heterostructure junctions operate on similar principles as the pGaN/nGaN structures but offer improved performance because the AlGaN layer forms a barrier that confines the excess carriers to the n-GaN. This concentrates excess holes and excess electrons in the same region. Structure 5B provides UV light because the emission comes from the n-GaN layer, and structure 5C provides blue light because the emission comes from the p-GaN layer. As the amount of Al in the confined layer is increased, the bandgap of the device is widened and the light emission frequency shifts further into the UV.

The substrate is typically GaN, sapphire, silicon, or GaAs.

EXAMPLE 7

Figure 6A:
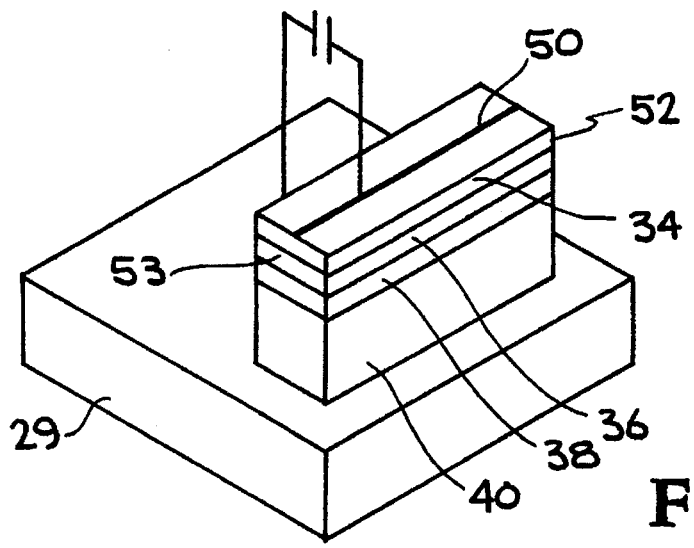
FIG. 6: is a diagram of use of the inventive pGaN or p-AlGaN in a laser.
Figure 6B:
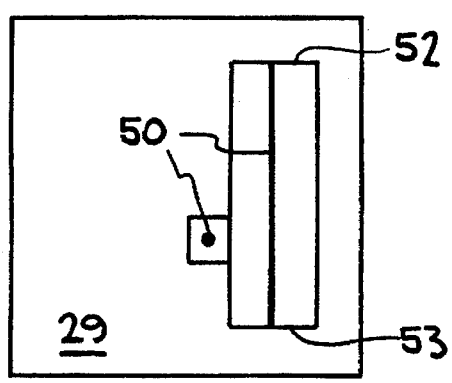

FIG. 6 illustrates a side view and top view of the inventive pGaN or p-AlGaN as a key element of a laser. The particular laser illustrated is made with a configuration illustrated in FIG. 5B above. The inventive p-type material is important because it can emit blue light.

For a laser based on the configuration in FIG. 5B, the laser photons are formed and captured in the nGaN layer, between the p-AlGaN and n-AlGaN layers of the device. A resonant cavity is formed by mirroring two surfaces of that layer. For example, the device can be cleaved and these cleaved planes act as mirrors. The mirrored surfaces are, for the side view, in the plane of the page with one mirror located on the surface illustrated and the mirror located beneath the structure as seen in the side view. In the top view, the mirrors are located perpendicular to the plane of the page and located at the top and bottom ends of the structure, as displayed on the page.

The description of illustrative embodiments and best modes of the present invention is not intended to limit the scope of the invention. Various modifications, alternative constructions and equivalents may be employed without departing from the true spirit and scope of the appended claims.

We claim:

1. A chemical compound comprising near intrinsic III-V semiconductor wherein
   a) the V semiconductor comprises nitrogen;
   b) the III semiconductor comprises between 80% to 100% gallium; and
   c) charge carriers are primarily holes having a mobility between 40 cm2/Volt-sec and 600 cm2/Volt-sec.

2. The chemical compound of claim 1 wherein hole concentration is between $10^{10}$ cm$^{-3}$ and $10^{20}$ cm$^{-3}$.

3. The chemical compound of claim 2 wherein hole concentration is between $10^{11}$ cm$^{-3}$ and $10^{19}$ cm$^{-3}$.

4. The chemical compound of claim 1 wherein between about 0 to about 10% of the gallium is replaced with other III semiconductor elements.

5. The chemical compound of claim 4 wherein the III semiconductor comprises gallium and aluminum.

6. A chemical compound comprising III-V semiconductor wherein
   a) the ratio of III semiconductor to nitrogen is between about 1.0:0.95 and stoichiometric
   b) the V semiconductor comprises nitrogen;
   c) the III semiconductor comprises at least 80% gallium; and
   d) charge carriers are primarily holes.

7. The chemical compound of claim 6 wherein the ratio of III semiconductor to nitrogen is approximately stoichiometric.

8. The chemical compound of claim 6 wherein the III-V semiconductor is an unintentionally doped material.

9. The chemical compound of claim 6 wherein the III-V semiconductor is an intentionally doped material.

10. The chemical compound of claim 9 wherein the p-type dopant is magnesium.

11. The method of making p-type GaN comprising,
    a. mounting a substrate on a heater;
    b. placing the heater and substrate in a vacuum chamber;
    c. biasing the substrate at a voltage sufficient to decelerate ions that approach its GaN growing surface;
    d. evacuating the chamber to a pressure low enough to operate a nitrogen source, mounted on or within the chamber;
    e. heating the substrate to a temperature between about 550° C. and about 900° C.;
    f. introducing nitrogen into the nitrogen source;
    g. extracting nitrogen ions into the chamber at the minimum energy allowed by the nitrogen source;
    j. depositing gallium onto the GaN growing surface at flux rate higher than the gallium desorbtion rate from the GaN growing surface.

12. The method of making p-type GaN comprising,
   a. mounting a substrate on a heater;
   b. placing the heater and substrate in a vacuum chamber;
   c. biasing the substrate at a voltage sufficient to decelerate ions that approach its GaN growing surface;
   d. evacuating the chamber to a pressure low enough to operate an ion gun, mounted on or within the chamber;
   e. heating the substrate to a temperature between about 550° C. and about 900° C.;
   f. introducing nitrogen into the ion gun;
   g. setting the nitrogen gun discharge voltage at a level sufficient to strike a plasma;
   h. increasing the nitrogen gun filament current until the plasma strikes;
   i. setting the nitrogen gun anode potential sufficient to extract ions;
   j. depositing gallium onto the GaN growing surface at flux rate higher than the gallium desorbtion rate from the GaN growing surface.

13. The method of claim 12 wherein, the substrate is cleaned before it is mounted on the heater.

14. The method of claim 12 wherein components in the vacuum chamber are outgassed before GaN growth is started.

15. The method of claim 12 wherein, a buffer layer of GaN is grown at a temperature between about 490° C. and about 550° C. before increasing the growing temperature.

16. The method of claim 12 wherein the buffer layer is grown for about 5 minutes.

17. The method of claim 12 wherein the substrate is biased at a voltage between about 5 volts and about 25 volts.

18. The method of claim 17 wherein the substrate is biased at a voltage between about 12 volts and about 22 volts.

19. The method of claim 18 wherein the substrate is biased at a voltage between about 16 volts and about 20 volts.

20. The method of claim 19 wherein the substrate is biased at about 18 volts.

21. The method of claim 12 wherein the substrate voltage is biased at a voltage between about 7 volts and about 17 volts lower than the anode voltage.

22. The method of claim 21 wherein the substrate voltage is biased at a voltage about 12 volts lower than the anode voltage.

23. The method of claim 12 wherein the pGaN is grown at temperatures between about 550° C. and about 700° C.

24. The method of claim 23 wherein the pGaN is grown at temperatures between about 590° C. and about 610° C.

25. The method of claim 24 wherein the pGaN is grown at about 600° C.

26. The method of claim 12 wherein the nitrogen ion gun is a 3 cm single grid Model II Kauffman ion gun.

27. The method of claim 26 wherein the gun's discharge voltage is set between about 25 volts and about 40 volts.

28. The method of claim 27 wherein the discharge voltage is set at about 25 volts.

29. The method of claim 26 wherein the gun's filament current is set between about 6 Amps and about 8 Amps.

30. The method of claim 26 wherein the gun's anode voltage is set between about 27 volts and about 40 volts.

31. The method of claim 30 wherein the anode voltage is set at about 30 volts.

32. The method of claim 12 wherein the anode voltage is set between about 2 volts and about 6 volts higher than the discharge voltage.

33. The method of claim 32 wherein the anode voltage is set about 3 volts higher than the discharge voltage.

34. The method of claim 12 wherein the gallium source is a Knudsen cell.

35. The method of claim 34 wherein the gallium source is a W-A Technologies Series 3 Knudsen cell.

36. The method of claim 35 wherein the gallium source is a W-A Technologies Series 3 Knudsen cell set at a temperature between about 1000° C. and about 1250° C.

37. The method of claim 36 wherein the gallium source is a W-A Technologies Series 3 Knudsen cell set at a temperature at about 1075° C.

38. The method of claim 12 wherein the gallium flux is between about $10^{13}$ atoms/cm$^2$-sec and about $10^{15}$ atoms/cm$^2$-sec.

39. The method of claim 38 wherein the gallium flux is between about $10^{14}$ atoms/cm$^2$-sec and about $10^{15}$ atoms/cm$^2$-sec.

40. The method of claim 12 wherein the gallium flux is about ten times the nitrogen ion flux.

41. The method of claim 12 additionally comprising depositing magnesium on the GaN growing surface at a rate between about $10^3$ to about $10^7$ times less than the deposition rate of gallium.

42. The method of claim 41 wherein the substrate bias is set to between about 0 to about 5 volts.

43. The method of claim 41 wherein the substrate bias is set to between about 5 volts to about 38 volts.

44. The method of claim 43 wherein the substrate bias is set to between about 15 volts to about 21 volts.

45. The method of claim 12 additionally comprising,
   a. cooling GaN;
   b. placing GaN in a sealable container;
   c. placing small pieces of Mg in the container;
   d. introducing nitrogen into the container;
   e. sealing the container;
   heating the sealed container to temperatures between about 770° C. and about 820° C. for times longer than at least about 50 hours.

46. The method of claim 45 wherein the sealed container is heated to about 800° C. for about 80 hours.

47. The method of claim 45 wherein the substrate bias is set to between about 0 to about 5 volts.

48. The method of claim 45 wherein the substrate bias is set to between about 5 volts to about 38 volts.

49. The method of claim 48 wherein the substrate bias is set to between about 15 volts to about 21 volts.

50. The method of claim 12 additionally comprising,
   a. implanting magnesium ions having an energy of between about 5 and 79 keV into the GaN surface;
   b. annealing the implanted GaN compound in flowing nitrogen at temperatures between about 700° C. and about 900° C. for times of between about 15 minutes to about 90 minutes.

51. The method of claim 50 wherein the implantation energy of the Mg ions is between about 20 keV and about 70 keV.

52. The method of claim 51 wherein the implantation energy of the Mg ions is between about 40 keV and about 60 keV.

53. A light emitting diode comprising,
   a. an n-GaN layer;
   b. a p-GaN layer comprising III–V semiconductor wherein
      i) the ratio of III semiconductor to nitrogen is between about 1.0:0.95 and stoichiometric ii) the V semiconductor comprises nitrogen;
iii) the III semiconductor comprises at least 80% gallium; and
iv) charge carriers are primarily holes, overlying the n-GaN layer; and electrical contacts attached to each layer.

54. A light emitting diode comprising,
 a p-GaN layer comprising III–V semiconductor wherein
  i) the ratio of III semiconductor to nitrogen is between about 1.0:0.95 and stoichiometric
  ii) the V semiconductor comprises nitrogen;
  iii) the III semiconductor comprises at least 80% gallium; and
  iv) charge carriers are primarily holes, overlying the n-GaN layer;
 b. an n-GaN layer overlying the p-GaN layer; and
 c. electrical contacts attached to each layer.

\* \* \* \* \*